United States Patent [19]

Kimball et al.

[11] Patent Number: 4,713,564
[45] Date of Patent: Dec. 15, 1987

[54] BOUNCE-NULLIFYING SWITCH UNIT

[75] Inventors: David B. Kimball, Shreveport, La.; Ruloff F. Kip, Jr., Westchester, N.Y.

[73] Assignees: American Telephone and Telegraph Company, AT&T Information Systems, Holmdel; AT&T Bell Laboratories, Murray Hill, both of N.J.

[21] Appl. No.: 810,958

[22] Filed: Dec. 19, 1985

[51] Int. Cl.[4] .................. H03K 17/56; H03K 5/01
[52] U.S. Cl. ................... 307/542.1; 307/268; 307/247.1; 340/365 E
[58] Field of Search ............... 307/268, 247 A, 542.1, 307/247.1; 340/365 E; 328/76; 329/164; 361/2

[56] References Cited

U.S. PATENT DOCUMENTS

| | | | |
|---|---|---|---|
| 3,866,092 | 2/1975 | Barns | 361/2 |
| 3,925,682 | 2/1974 | Hamada | 307/247 A |
| 3,943,381 | 3/1976 | Uchidoi | 307/247 A |
| 4,028,560 | 6/1977 | Bainter | 307/247 A |
| 4,159,497 | 6/1979 | Hilliard, Jr. et al. | 361/2 |
| 4,225,853 | 9/1980 | Hamilton | 307/247 A |
| 4,349,076 | 9/1982 | Oldendorf et al. | 307/247 A |
| 4,375,036 | 2/1983 | Miller et al. | 307/247 A |
| 4,392,065 | 7/1983 | Stiglich | 307/247 A |
| 4,417,155 | 11/1983 | Aizawa | 307/247 A |

*Primary Examiner*—Stanley D. Miller
*Assistant Examiner*—B. P. Davis
*Attorney, Agent, or Firm*—Ruloff F. Kp

[57] ABSTRACT

The opening and closure of the contacts of a push-button actuated switch produces across impedance means a voltage which is stably high and low when such contacts are maintained closed and open, respectively. Bouncing of the contacts after their initial closures and openings produces superposition on the stable levels of such voltage of trains of impulses caused by such bouncing. A bistable semiconductor flip-flop is coupled to the impedance means to sense such voltage and to assume a "high" state and a "low" state only when the stable level of such voltage is, respectively, high and low and, further, the flip-flop receives a clock signal. A retriggerable semiconductor monostable multivibrator is coupled to such impedance means to be triggered by such impulses from its stable "off" state to its unstable "on" state which is repetitively renewed by repetitive retriggering of the multivibrator. The multivibrator produces such clock signal only when it reverts to "off" state following the last of the impulses in each train thereof. The impedance means may be a simple resistor or, alternatively, a pulse generating circuit productive of a trigger for the multivibrator in response to either a positive-going or a negative-going fast change in voltage produced by such impulses.

4 Claims, 6 Drawing Figures

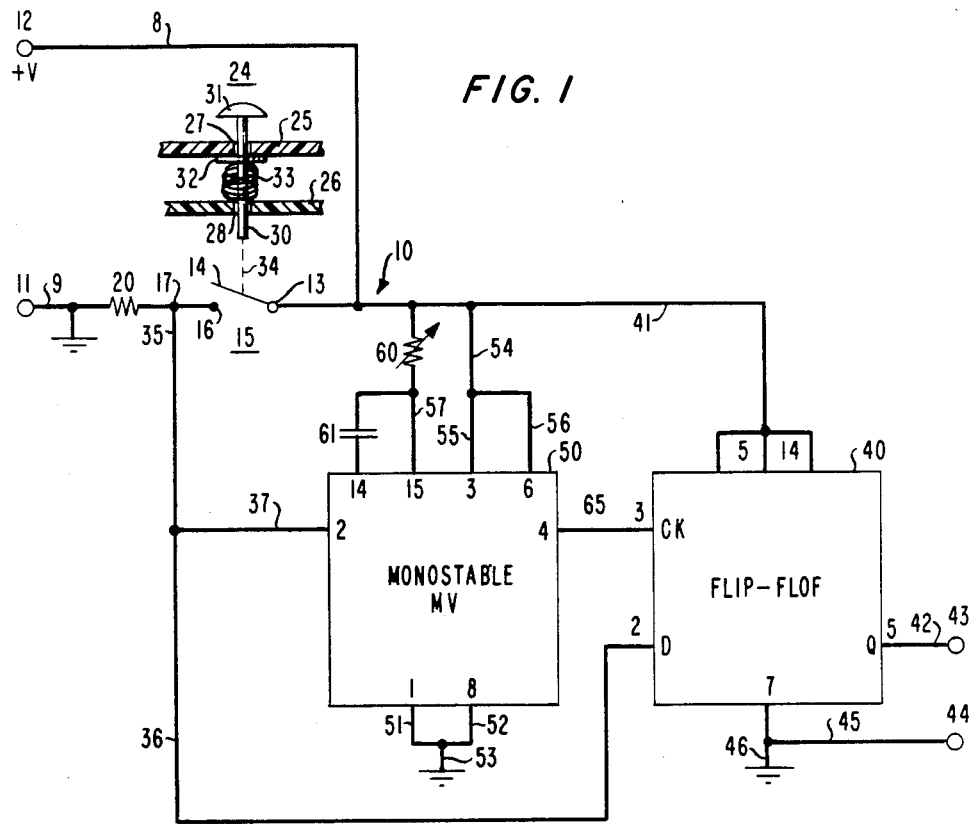
FIG. 1
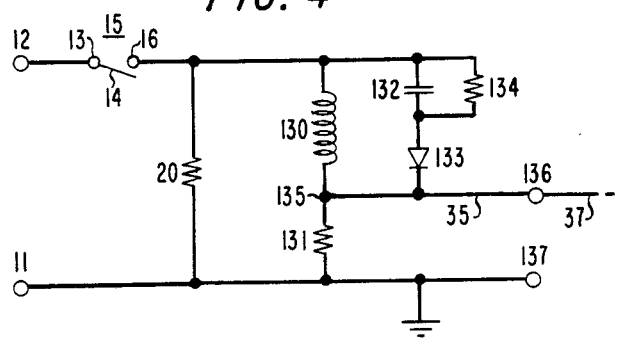
FIG. 4
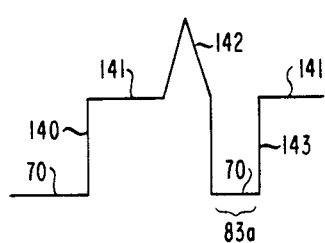
FIG. 5
FIG. 6

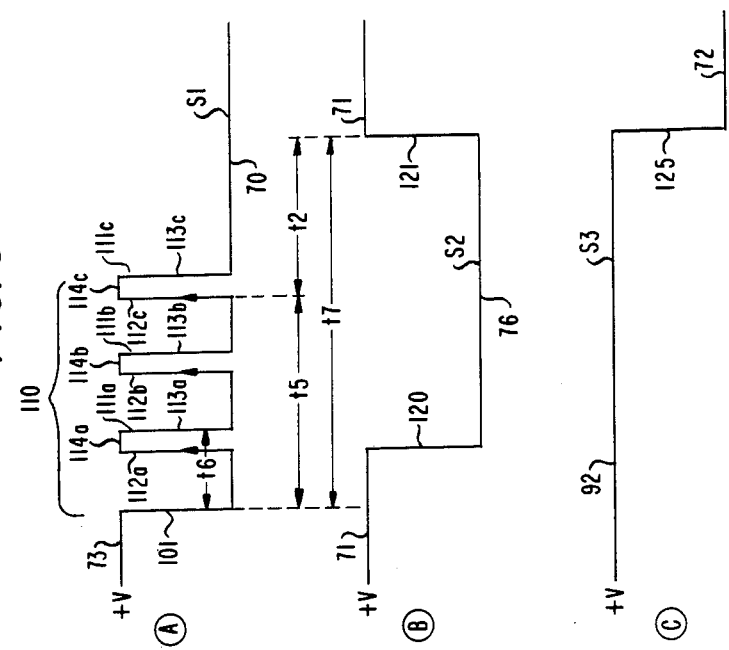
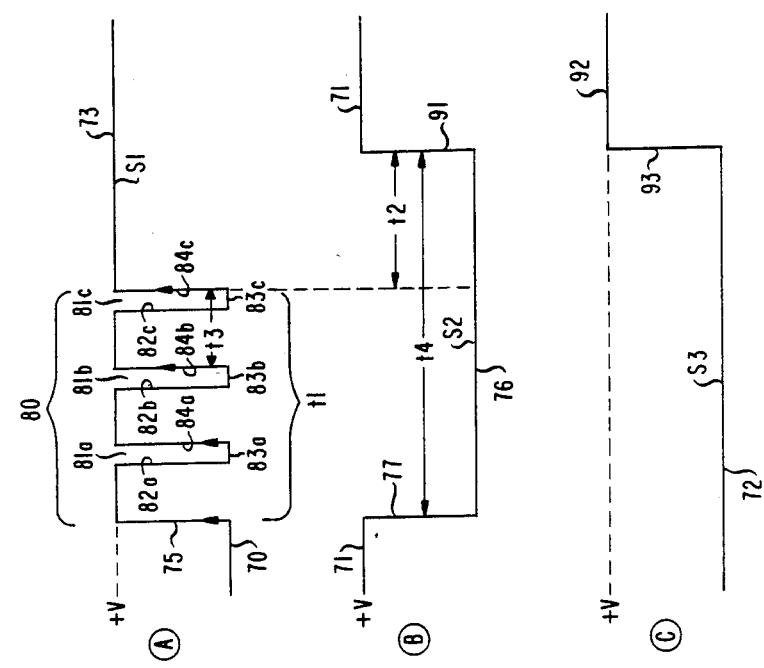

4,713,564

BOUNCE-NULLIFYING SWITCH UNIT

FIELD OF INVENTION

This invention relates generally to switch units including a mechanical switch and circuitry for producing an electrical output indicative of the closed or open condition of contacts of the switch. More particularly, this invention relates to switch units of such kind further including means for nullifying the effect on such output of electrical transients caused by mechanical bouncing of such contacts.

BACKGROUND OF THE INVENTION

When a pair of contacts of a mechanical switch are changed between closed and open condition, it is commonplace for such contacts to transiently undergo a bouncing with each other. Thus a closure, for example, of the contacts is followed by a momentary reopening thereof followed by another momentary closing, and so on, until the transient re-closings and re-openings terminate to leave the contacts stably closed. Conversely, in some switches an initial opening of the contacts is followed by their momentary closure followed by another momentary opening thereof, and so on, until, again the transient reclosings and re-openings terminate to leave the contacts stably open.

The foregoing may be described in mechanical terms as a train of mechanical opening-closing contact impulses and, for some switches, such trains are produced upon switching of the contacts both to closed condition and open condition. The generation of such trains of mechanical impulses creates, however, in switch units for electrically signaling such conditions, the problem that such mechanical impulses are prone to produce in such units corresponding trains of extraneous electrical impulses which may cause the unit to produce a false signal or which, alternatively, may be passed on from the output of the unit to cause spurious or undesirable effects at some point further on.

A technique already used in the art for dealing in switch units with such extraneous electrical impulses is to interpose between the switch contacts and the electrical output of the unit a buffering bi-stable flip-flop responsive to closing and opening of the contacts to indicate the same while concurrently being rendered insensitive to extraneous electrical impulses caused by such closing and opening. Thus, for example, U.S. Pat. No. 4,349,076 issued Sept. 14, 1982 in the name of Christian Oldendorf for "Change-Over Switch with De-Chattering Device for Electronic Weighing Scales" discloses a switch unit comprising a two-contact switch and a bistable semiconductor flip-flop which is responsive to closing and opening of the switch to be triggered to first and second electric states thereof while concurrently not being affected by extraneous electrical impulses produced upon closing of the switch. That switch unit has, however the disadvantages that the flip-flop is required to be of nonstandard asymmetrical design and that, insofar as can be determined, the switch unit includes no provision for dealing with extraneous electrical impulses produced upon opening of the switch.

SUMMARY OF THE INVENTION

In contrast to the foregoing, a switch unit according to the invention inone of its aspects comprises, switch means having contacts movable by closing and opening with each other to maintain closed and open conditions thereof with bouncing of limited duration of said contacts following initial movement of said contacts between being open and closed, circuit means responsive to closing and opening of said contacts to produce a continuing signal of different values when said contacts are, respectively, open and closed, said signal including transients induced by said initial movement and by said bouncing, and signal-controlled multivibrator means responsive after triggering thereof to said diferent values of said signal to change state to indicate said maintained closed and open conditions of said contacts by different states correspondingly maintained by such means, said multivibrator means, being retriggerable after said initial movement of said contcts by transients induced by said bouncing to postpone such change of state until after termination of the last of such bounce induced transients. The employment as described of retriggerable multivibrator means yields the advantage among others that the switch unit is rendered immune from the effect thereon of bounce induced transients produced upon opening of the switch as well as upon its closing, and that the multivibrator means may comprise one or more standardized multivibrators readily available on the market so as, thereby, to be of low cost.

According to the invention in another as its aspects, the mentioned multivibrator means may comprise (1) a bistable flip-flop adapted to change to first and second states thereof indicative of maintained closed and open conditions of said contacts only when such flip-flop senses that such signal has a value corresponding to the mentioned condition to which the contacts have been actuated and, moreover, receives a clock to change state, and (2) a retriggerable monostable multivibrator adapted to develop such clock by changing from an unstable "on" state to normal stable "off" state and retriggerable by bounce induced transients in such signal to remain in such "on" state until termination of the last of such transients. According to the invention in still another of its aspects, the retriggerable multivibrator means is triggerable by triggers thereto of only one of the two possible directions of excursion (i.e., positive-going and negative-going) for such triggers, and pulse generating means is employed to convert transient excursions of either such direction in such signal into triggers of such one direction.

BRIEF DESCRIPTION OF THE DRAWINGS

For a better understanding of the invention, reference is made to the following description of a representative embodiment thereof, and to the accompanying drawings wherein:

FIG. 1 is a partially schematic and partially block diagram of an exemplary switch unit according to the invention;

FIG. 2 is a diagram of waveforms characterizing the operation of the FIG. 1 unit upon closure of switch contacts therein;

FIG. 3 is a diagram of waveforms characterizing the operation of the FIG. 1 unit upon opening of such switch contacts.

FIG. 4 is a schematic diagram of a modification of the front end of the FIG. 1 switch unit; and FIGS. 5 and 6 are waveform diagrams, characterizing the operation of the FIG. 1 switch unit when incorporating the FIG. 4 modification thereof.

DETAILED DESCRIPTION OF EMBODIMENT

Referring to FIG. 1, the reference numeral 10 generally designates a switch unit having input terminals 11, 12 for application of d.c. power to the unit. In the unit 10, terminal 11 is grounded and terminal 12 is adapted to receive a positive (+V) voltage relative to ground.

Connected between those terminals in series from terminal 11 to terminal 12 is a lead 8, a lead 13, a movable contact 14 of a switch 15, a fixed contact 16 belonging to that switch and adapted to make and break with contact 15, a lead 17 having one end connected to fixed contact 16, impedance means in the form of a resistor 20 connected at opposite ends thereof to, respectively, the other end of lead 17 and a lead 9 in turn connected to ground terminal 11.

Switch 15 is adapted to be operated to produce closure or opening with each other of its contacts 14, 16 by actuator means 24 comprising a pair of substantially parallel thin spaced-apart upper and lower structural members 25 and 26 having formed therein respective holes 27, 28 in registration with each other to define a passageway of fixed alignment through both members. Slidably received in that passageway is a plunger 30 of which the top and bottom are, respectively, above member 25 and below member 26, and of which the top has thereon a push button 31. Between the members 25 and 26, plunger 30 carries in fixed relation therewith a flange 32 of larger diameter than hole 27. Interposed between flange 32 and member 26 is a helical compression spring 33 encircling plunger 30 and having opposite ends bearing against, respectively, the bottom of flange 32 and the top of member 26. Spring 33 imparts to the flange, plunger and pushbutton a upward yieldable resilient bias normally maintaining the pushbutton 31 in its uppermost or full out position.

The bottom of plunger 30 is coupled by a linkage 34 (schematically represented in dotted line) to movable contact 14. When button 31 is displaced by normal force from its full out position to the button's full in position at which further inward movement of the button is stopped by its coming into contact with member 25, linkage 34 drives movable contact 14 from an initial open condition with fixed contact 16 to a closed condition therewith. When button 31 is in its full in position and the resilient force provided by spring 33 then restores the button from that position to its full out position, linkage 34 displaces movable contact 14 away from fixed contact 16 to change the condition of these contacts from closed condition to open.

The ohmic junction provided by lead 17 of fixed contact 16 with resistor 20 is connected by leads 35 and 36 to the $\overline{D}$ port of a multivibrator in the form of a semiconductor bistable flip-flop 40 which is of standard design, and which conveniently (but not necessarily) may be a 7400 Series (as, for example, a "7474") TTL logic bistable flip-flop commercially available from the Signetics Corporation at its sales office at 312 North Central Expressway, Suite 213, Richardson, Tex. 75080 and available, also, from a number of other companies. Flip-flop 40 is connected by its port #7 to ground. The flip-flop is adapted to receive d.c. power from input terminal 12 via lead 8 and a power distributing lead 41 of which one end is connected to lead 8 and the other end is connected to various parts of the flip-flop. The Q or output port of flip-flop 40 is connected via lead 42 to a terminal 43 which is one of a pair of output terminals for switch unit 10, the other of such output terminals being the terminal 44 shown as being connected via lead 45 to port #7 of the flip-flop and via lead 46 to ground.

Connected by leads 35 and 37 to the junction of fixed contact 16 and resistor 20 is the #2 port of a retriggerable semiconductor monostable multivibrator 50 having its ports #1 and #8 connected to ground via leads 51, 52 and 53. Flip-flop 40 and monostable multivibrator 50 may be considered to together constitute a multivibrator means. Multivibrator 50 is conveniently (but not necessarily) a 7400 Series (for example, a "74123") TTL logic retriggerable monostable multivibrator commercially available from the Signetics Corporation at its aforementioned sales office (and available, also, from other companies). The multivibrator is adapted to receive d.c. power from power distributing lead 41 via leads 54, 55, 56 to the ports #3 and #6 of such multivibrator. Port #15 of that device is adapted to receive such power via the series connection of a lead 57 connected to that port and an adjustable 20K resistor 60 connected at its upper end to lead 41. The lower end of resistor 60 is coupled through a 10 microfarad capacitor 61 to port 14 of the multivibrator. Multivibrator 50 has a stable "off" state and an unstable "on" state, and elements 60, 61 form an adjustable impedance RC circuit adapted by adjustment of the variable resistor 60 to adjust the one-shot duration of that "on" state. The $\overline{Q}$ output port of multivibrator 50 is connected via lead 65 to the clock or $\overline{CK}$ input port of bistable flip-flop 40 to affect the operation of such flip-flop 40 in a manner which will now be described.

OPERATION OF EMBODIMENT

Assume to begin with that unit 10 is supplied with d.c. power and that switch contacts 14, 16 are open. The operating conditions characterizing the unit are shown by the initial portions of the FIG. 2 waveforms. In that figure, waveform A represents the level relative to ground of a switch signal S1 generated at the junction of fixed contact 16 and resister 20. Waveform B represents the level relative to ground of an output signal S2 from multivibrator 50 at its $\overline{Q}$ port. Waveform C represents the level relative to ground of a signal S3 which appears at the Q port of flip-flop 40 and at output terminal 43 and which, thus, is the output signal from unit 10.

As indicated by the initial parts of those waveforms, when switch 15 is open, the switch signal S1 is at a low (ground) stable level 70, the multivibrator output signal S2 is at a high stable level 71 to indicate that multivibrator 50 is in its stable "off" state, and the flip-flop output signal S3 is at a low stable level 72 produced by the flip-flop being in a second of two bistable electrical states which can be assumed thereby. That low level of signal S3 corresponds to and is indicative of the absence of voltage developed across resister 20 and, thus, that the contacts of switch 15 are open.

Assume now that push button 31 is manually depressed to full in position to thereby produce closure between the switch contacts 14 and 16. Current responsively flows though elements 15 and 20 to cause switch signal S1 to undergo a change from its low stable level 70 to a high level 73 therefor by a steep positivegoing rise 75 in level. That rise 75 triggers multivibrator 50 to transit from its stable "off" state to its unstable "on" state and to thereby cause multivibrator output signal S2 to change from its high level 71 to a low level 76 by a steep negative-going drop 77 in the level of that signal.

As for flip-flop 40, the presence at its port D of the high level 73 reached by signal S1 (and communicated to that port via lead 36, does not immediately cause the flip-flop to transit from its second to its first state to thereby cause signal S3 to go from low to high level. The reason for this is that the absence at the time of a ositive going trigger rise produced in signal S2 and communicated to the $\overline{CK}$ port of flip-flop 40 disables the flip-flop from a transiting from its second to its first state. To put it another way, the connections of flip-flop 40 are such that it can transit from its second to its first state only when both the level of S1 at the flip-flop's $\underline{D}$ port is high and S2 produces a positive-going trigger or clock at the flip-flop's $\overline{CK}$ port.

With regard to signal $\overline{S2}$, it will not return to its high level until multivibrator 50 changes from its unstable "on" state to which it has been triggered back to its normal "off" state. Such changing back to "off state" of the multivibrator cannot, however, occur until after the elapse of a certain time interval following triggering of the multivibrator. For only one triggering of the multivibrator that interval has a value t2 which is the one-shot duration of the "on" state of the multivibrator. As later explained in more detail, however, multivibrator 50 is retriggerable so that such time interval can be extended.

To summarize, the overall effect of monostable multivibrator 50 on flip-flop 40 during the initial closure of switch contacts 14, 16 is to postpone the transiting of flip-flop 40 from its second state to its first state and to correspondingly postpone a change in level of signal S3 from low to high level.

The events described above as taking place are events occurring upon the first closure of switch contacts 14 and 16. Following that first closure, the contacts bounce to superpose on the high level 73 of signal S1 a train 80 of periodic electrical impulses which includes the impulses 81a, 81b, 81c caused by the bouncing and is deemed also to include the initial voltage rise 75, in which case, train 80 constitutes the train of voltage rises in signal S1. While three bounce impulses 81a, 81b, 81c are shown, the number of such impulses may vary. For any number of such impulses, the train 80 (including rise 75) has a duration t1 equal to the number of impulses (including rise 75) in the train multiplied by the time period t3 between consecutive ones of such impulses. Such values t1 and t3 have the relationship to the one-shot "on" state duration t2 of the multivibrator that t2 is greater than t3 but less than t1. The superposition in the signal S1 (FIG. 2, waveform A) of the "bounce" impulses 81a, 81b, 81c with the high level 73 of that signal produces the result that such impulses, as manifested in the signal waveform, comprise respective initial steep negative-going drops 82a, 82b, 82c followed by respective short intervals 83a, 83b, 83c for which S1 is at low level followed by steep positive going rises 84a, 84b, 84c back to the high signal level 73. The effect of each such rise 84 on multivibrator 50 is that, prior to the time the "on" state, which the multivibrator is then in, has reached the end of its one-short duration t2, the rises 84 repetitively retrigger the multivibrator so as, with each retrigger, to, in effect start a new "on" state with a one-shot duration t2 or, to look at it another way, to renew the "on" state so that it will not terminate after the elapse of a time t2 following the next preceding triggering rise in signal S1. Thus, the succession of rises 75 and 84a, 84b, 84c in signal S1 will cause multivibrator 50 to remain in a "coalesced" "on" state for a time interval t4 which is extended in relation to the one-shot duration t2 for such "on" state, and which time interval t4 is equal to the sum of (a) the one-shot duration of the "on" state of multivibrator 50 which follows after the generation of the last impulse 84c in the train80 of impulses, and (b) the duration t1 of the train 80 (including rise 75) of electrical impulses. At the end of time interval t4, multivibrator 50 of its itself reverts to its normal stable "off" state to thereby cause signal S2 to change from its low level 76 to it's high level 71 therefor by a steep rise 91 in the level of such signal. That rise 91 in signal S2 is communicated via lead 65 to the $\overline{CK}$ port of flip-flop 40 to provide a positive going clock to that port. Concurrently, the flip-flop is seeing a high signal level at its $\underline{D}$ port from the voltage which is produced across resister 20 by the closure of switch contacts 14, 16, and which is communicated as switch signal S1 via leads 35 and 36 to such $\underline{D}$ port. Hence, the condition that flip-flop 40 must see a high at its $\underline{D}$ port and receive a positive clock at its $\overline{CK}$ port to change from the flip-flop's second to first state is a condition which is now satisfied. Flip-flop 40 accordingly does so change from its second to its first state to cause signal S3 at the Q port of the flip-flop and at output terminal 43 to change from its low level 72 to a high level 92 by undergoing a steep rise 93 in level. Since each of the two states of flip-flop 40 is stable until that flip-flop is triggered to another state, flip-flop 40 will now remain in its first state with signal S3 being at high level 92 so long as contacts 14 and 16 of switch 15 remain closed with each other. The presence of high signal level 92 appearing between the output terminals 43 and 44 of switch unit 10 provides an indication by that unit that switch 15 has been and remains closed.

When contacts 14 and 16 of switch 15 are reopened by release from manual pressure of push button 31 and consequent restoration by spring 33 of the push button to its full out position, there takes place a sequence of events which is in respects the converse of the sequence described above, and which is depicted in the waveforms A, B and C of FIG. 3. More specifically, upon the initial re-opening of those contacts, the signal S1 (FIG. 3, waveform A) changes fromits high stable level 73 back to its low stable level 70 by a steep drop 101. That change in level and that drop are communicated via leads 35 and 37 to multivibrator 50 and via leads 35 and 36 to the $\underline{D}$ port of flip-flop 40. The negative going drop 101 has, however, no effect on multivibrator 50 because that device can be triggered only by positive going rises. Also, the low level 70 seen by flip-flop 40 at its $\underline{D}$ port does not cause transit of the flip-flop from its first state it is then in over to its second state because no trigger has been received at the flip-flop's $\overline{CK}$ port to initiate such change in state. Thus, despite the opening of switch contacts 14–16 and the resultant drop in level in signal S1, flip-flop 40 for the time being remains in its first state, and the signal S3 from the flip-flop remains at its high level 92.

The initial re-opening of contacts 14, 16 is followed by bouncing of the contacts producing in signal S1 a train 110 which includes impulses 111a, 111b, 111c caused by the bouncing and is deemed also to include the initial voltage drop 101. While three of the bounce impulses are shown, the number of them may vary. The superposition of such bounce impulses 111a, 111b, 111c in signal S1 with the low level 70 thereof causes such impulses to be manifested in the waveform of the signal as respective positive-going rises 112a, 112b, 112c to high level 73 followed by short intervals 114a, 114b, 114c at which S1 is at such level followed by respective negative-going drops 113a, 113b, 113c back to low level 70. The time duration from voltage drop 101 to the voltage rise 112c characterizing the last bounce impulse 111c has a value of t5, and that duration is (to so close an approximation that the difference can be ignored) also the duration of the whole impulse train 110 (including voltage drop 101) when train 110 is considered as being the train of the drops 101, 113a, 113b, 113c. Such duration t5 is equal to the number of impulses (including drop 101) in train 110 multiplied by the period t6 between consecutive ones of such impulses. The relation between train duration t5, period t6 and the one-shot duration t2 of the "on" state of multivibrator 50 is that t2 is greater than t6 but less than t5. The period t6 between the impulses in train 110 produced by re-opening of contacts 14, 16 is normally the same as the period of the impulses in the train 80 (FIG. 2) of impulses produced on closure of those contacts.

The voltage rise 112a of the first bounce impulse 111a in impulse train 110 (FIG. 3) triggers multivibrator 50 from its stable "off" state to its unstable "on" state to cause signal S2 (FIG. 3, waveform B) to change from its high level 71 to its low level 76 by undergoing voltage drop 120. The voltage rises 112b, 112c of the following bounce impulses 111b, 111c repetitively retrigger the multivibrator to remain in a coalesced "on" state which endures after rise 112c of the last bounce impulse 111c for the one-shot duration t2 characterizing the "on" state of the multivibrator when only once triggered. At the end of an interval extending after the occurrence of initial voltage drop 101 for a time t7 equal to the sum of t5 and t2, multivibrator 50 of itself reverts from its unstable "on" state to its normal "off" state.

When multivibrator 50 so reverts, its output signal S2 (FIG. 3, waveform B) changes from its low level 76 back to its high level 71 by undergoing a steep voltage rise 121 communicated by lead 65 to the $\overline{CK}$ port of flip-flop 40 to provide a positive going clock for the flip-flop. At that time the flip-flop is seeing at its $\overline{D}$ port the low level 70 at which signal S1 has remained (FIG. 3, waveform A) after occurrence of the last bounce impulse 111c. The concurrence of low signal 70 and of clock rise 121 at, respectively, the $\overline{D}$ and $\overline{CK}$ ports of flip-flop 40 is the condition necessary and sufficient for the flip-flop to change from its first to its second stable state. Accordingly, the flip-flop makes such change to cause the signal S3 (FIG. 3, waveform C) at the flip-flop's Q port and at output terminal 43 to change from its previous high level 92 to its low level 72 by undergoing voltage drop 125. The existence of such low level 72 between the output terminals 43 and 44 of switch unit 10 signals that the switch 15 of that unit is in open condition.

An interesting feature of switch unit 10 is so that the electrical impulses produced by bouncing of the contacts 14, 16 upon their opening and closing are not merely suppressed but, rather, play a positive role in the operation of the unit while, at the same time, not producing false indications therefrom or being passed on from the output thereof. Because of such positive participation of such impulses in the operation of the unit, that unit has the advantages that it will operate as described above irrespective of the number of bounces produced upon switching of such contacts, that, if the number of bounces is few, the time delay of the flip-flop in registering the condition of the contacts is shortened and so that, if the number of bounces are many, the unit 10 can accommodate them.

A further advantage of switch unit 10 is that, within a substantial range of variation, its operation is independent both of the amplitude of the electrical impulses produced by contact bouncing and of the duty cycle during such trains of impulses of the duration of the transient signal levels produced in signal S1 by such impulses in relation to the periods of such impulses. Still further, while such impulses have been characterized above as being periodic, unit 10 will operate satisfactorily as described above when such impulses are aperiodic so long as the longest period between consecutive impulses does not exceed the one-shot "on" state duration time of the multivibrator 50. Still, further, unit 10 is adapted to nullify the undesirable electrical effects of contact bouncing when such bouncing occurs upon opening of the contacts as well as upon their closing.

Other advantages of unit 10 are that it can be made entirely from electrical components which are readily available commercially, and that the unit is simple in electrical design and low in cost.

FIG. 4 Modification

The switch unit 10 as shown in FIG. 1 has the characteristic that, if upon change of switch 15 from a closed condition to open condition (FIG. 3), the switch contacts 14, 16 do not bounce, no positive voltage rise will be generated to trigger multivibrator 50. Such characteristic can, however, be eliminated by modifying the circuitry shown in FIG. 1 by adding to the front end thereof the pulse generating circuit shown in FIG. 4. In that circuit, the resistor 20 has coupled in parallel therewith, the series combination of an inductor 130 and a resistor 131 which preferably (but not necessarily) is larger in resistance value than resistor 20. Elements 130 and 131 are connected to, respectively, the top and bottom of resister 20. The inductor 130 in turn has coupled in parallel therewith the series combinations of a capacitor 132 and a diode 133 with elements 132 and 133 being connected to, respectively, the top and bottom of inductor 130, and with diode 133 being oriented to offer its low forward resistance to current flowing downwardly therethrough. Capacitor 132 is shunted by a discharge resister 134. The junction 135 of the inductor 130 and resister 131 is coupled to the lead 35 which (FIG. 1) supplies the signal S1 to flip-flop 40 and multivibrator 50.

The FIG. 4 circuit operates to generate pulses in a manner as follows. When switch 15 is driven to closure by actuator means 24, the voltage rise 75 (FIG. 2) produced across resister 20 by the initial closure of contacts 14, 16 is communicated in the FIG. 4 circuit through the series path of capacitor 132, diode 133 and resistor 131 to appear across that resistor and in signal S1 as a voltage rise 140 (FIG. 5) only slightly less in value than rise 75. That is so, because capacitor 132 offers low impedance to a sudden change in voltage, and diode 133 offers low resistance to downward flow of current therethrough.

During the time after rise 75 that contacts 14 and 16 dwell closed before they first bounce back open, the top plate of capacitor 132 charges positive relative to its bottom plate by flow of current downward through elements 132, 133, 131 and downward current also flows through inductor 130 and resistor 131. The result of such current flows is that, during such dwell, the voltage across resistor 131 maintains signal S1 at a high level 141. At the end of that dwell period, contacts 14 and 16 bounce open to cut off the flow of current through those contacts to the FIG. 4 circuit. That current cut-off tends to produce a sharp drop in the current through inductor 130 and an accompanying sharp decrease in the magnetic flux linking that inductor. That decrease, however, generates in the inductor between its opposite ends a voltage rise directed to produce a transient flow of current clockwise around the circuit path including inductor 130, resistor 131 and resistor 20, and the flow of such transient current develops in such path a voltage drop divided between resisters 131 and 20 in proportion to their respective resistance values. Hence, the flow of such transient current produces across resistor 131 and at junction 135 a positive going pulse of voltage which appears in signal S1 as a positive voltage spike 142 immediately proceeding the drop 82a of that signal to the low level 70 maintained thereby during interval 83a of the first bounce of contacts 14, 16. The generation of that pulse causes multivibrator 50 to be retriggered.

During interval 83a, the charge accumulated across capacitor 132 will be partly or fully discharged by downward flow of current from the capacitor's top plate through discharge resistor 134 to the capacitor's bottom plate. Hence, at the end of interval 83a, the FIG. 4 circuit will be readied to generate for retriggering of multivibrator 50 a voltage rise 143 similar to the rise 84a (FIG. 2) but somewhat smaller invalue because of the forward resistance of diode 133 and the consideration that capacitor 132 may not have fully discharged when contacts 14, 16 again close at the end of their first bounce.

The effect of the addition of the FIG. 4 circuit to the FIG. 1 circuitry is thus to cause the multivibrator 50 to be retriggered at both the beginning and the end of the first bounce interval. In a similar manner, that multivibrator will be retriggered at both the beginning and end of the bounce intervals 83a, 83b and any other bounce intervals (not shown) which may follow.

The FIG. 4 circuit works as follows when switch 15 is operated by actuator means 24 to open switch 14, 16. Prior to the opening, the voltage across resistor 20 will be at its high level 73 (FIG. 3) and, in the FIG. 4 circuit, capacitor 132 is fully charged, full current is flowing through inductor 130 and resistor 131, and the flow of such current through that resistor genertes in signal S1 a high voltage level 145 (FIG. 6). Upon the initial opening of the mentioned switch contacts, the resulting cut off in the current flowing through those contacts to the FIG. 4 circuit causes that circuit to develop in the signal S1 a positive-going spike 146 which immediately precedes a fast voltage drop 147 in signal S1 to its low level 70, and which is generated by the FIG. 4 circuit in the same way, as described above, spike 142 was generated. Spike 146 triggers multivibrator 50 to change from "off" state to "on" state. Thus, even if contacts 14 and 16 do not bounce after being initially opened, the multivibrator 50 at the end of a one shot duration of its "on" state will, as earlier described, supply to flip-flop 40 a voltage rise which is similar to the rise 121 (FIG. 3), and which clocks the flip-flop (then receiving at its D̄ port the signal S2 at low level level 76) to change state so as to change its output signal S3 from high level 92 to low level 72.

On the other hand, if contacts 14 and 16 are operated so as, after their initial opening to undergo bounce intervals 114a, 114b, 114c (FIG. 3), the FIG. 4 circuit will operate to generate respective positive voltage spikes similar to spike 146 and occurring at the ends of such intervals and each serving to retrigger multivibrator 50 at such interval ends following the retriggering of the multivibrator by the voltage rises 112a, 112b, 112c at the beginnings of such intervals.

The overall effect of the inclusion of the FIG. 4 circuit in the described switch unit 10 is thus to make the operation of that unit independent of the manner of opening and closing of switch contacts 14, 16. That is switch unit 10 including the FIG. 4 circuit will operate to provide by its output signal S3 the same indications of the closed and open conditions of switch 15 whether the closing of its contacts is a bouncing or a bounceless closure and whether the opening of its contacts is a bouncing or bounceless opening.

The above described embodiment being exemplary only, it is to be understood that additions thereto, omissions therefrom and modifications thereof can be made without departing from the spirit of the invention hereof. For example but without restriction, while the described embodiment has been disclosed herein as incorporating switch contacts actuated by a push button mechanism, the invention is of application to switch contacts which are relay contacts or are otherwise parts of a wide variety of switch mechanisms other than push button actuated switches. As another example, while the one-shot "on" state duration of the monostable multivibrator is preferably shorter than the duration of the train of electrical impulses produced by contact bounce, if desired the former duration can be made longer than the latter. As still other examples, the invention is applicable to momentary as well an non-momentary switches and latching as well as non-latching relays, whether manually, electrically, magnetically, thermally, electrostatically actuated or actuated by pressure or by any other means of actuation.

Accordingly, the invention is not to be considered as limited save as is consonant with the scope of the following claims.

What is claimed is:

1. A bounce-nullifying switch unit comprising, input terminals for supplying d.c. power to said unit and consisting of a positive voltage terminal and a ground terminal, a switch and a resistor connected in series between said terminals with said switch and resistor having a junction therebetween and being relatively nearer to, respectively said positive voltge terminal and said ground terminal, said switch comprising contacts closeable and openable with each other and bounceable with each other after initial closure and initial opening thereof, and said series circuit being responsive to closing an dopening of said contacts to develop at said junction between said switch and resistor a voltage relative to ground which is of high and low stable level when said contacts are, respectively, closed and open, and which voltage includes trains of impulses, developed after each initial closure and opening of such contracts and caused by such bouncing thereof and providing corresponding trains of positive-going rises respective to said impulses and manifested in said voltage, a semiconductor bistable flip-flop coupled to said junction to recieve said voltage and changeable from a low to a high voltage state, and from said high voltage state back to its low voltage state, only when the stable level of said voltage is, respectively, high and low, and only when, moreover said flip-flop is clocked by a positive going clock signal, a retriggerable monostable multivibrator coupled to said junction and responsive to a positive-going rise in said voltage to change from a stable "off" state to an unstable "on" state having a one-shot duration longer than the longest period of time between consecutive ones of such impulses insaid trains, said multivibrator having its output coupled to said flip-flop and being productive at said output, for clocking said flip-flop, or a positive-going clock signal produced by reversion of said multivibrator from its "on" state to its "off" state, and said multivibrator being repetitively retriggered by said positive-going rises in said trains thereof to repetitively renew the "on" state of such multivibrator so as to delay the production of said clock signal until after termination of the last of the impulses in the train thereof following each closure and opening of said contacts.

2. A switch unit comprising, switch means having contacts movable by closing and opening with each other to maintain closed and open conditions thereof with bouncing of limited duration of said contacts following initial movement of said contacts between being open and closed, circuit means having an input and an output and responsive to an electrical indication at such input of such closing and openings of said contacts to produce at said output a continuing signal of different values when said contacts are, respectively, open and closed, said signal including transients induced by said initial movement and by said bouncing, a bistable flip-flop having an output and, also, an input coupled to said output of said circuit means to be responsive to different values of said signal corresponding to, respectively, said maintained closed and open conditions of said contacts so as, only when said flip-flop is clocked, to change to maintained first and second states thereof manifested at such output of said flip-flop and indicative of, respectively, said maintained closed and open contact conditions, and a retriggerable monostable multivibrator having an input coupled to said output of said circuit means to be triggered by transients in said signal to change from a stable "off" state to an unstable "on" state and to then revert to said "off" state, and having, moreover, an output coupled to an additional input of said flip-flop to supply an indication of such change of state to the last named input so that such reverting clocks said flip-flop, said monostable multivibrator being retriggerable by bounce induced transients in said signal to postpone such change in state of said flip-flop until after occurrence of the last of such transients.

3. A switch unit comprising, switch means having contacts movable by closing and opening with each other to maintained closed and open conditions thereof with bouncing of limited duration of said contacts following initial movement of said contacts between being open and closed, circuit means having an input and an output and responsive to an electrical indication at said input of such closing and opening of said contacts to produce at said output a continuing signal of different values when said contacts are, respectively, open and closed, said signal including transients induced by said initial movement and by said bouncing, signal-controlled multivibrator means having an output and, also, an input coupled to said output of said circuit means, such multivibrator means being responsive after triggering thereof to said different values of said signal to change state to indicate said maintained closed and open conditions of said contacts by different states correspondingly maintained by such means and manifested at said output of said multivibrator means, said multivibrator means being retriggerable after said initial movement of said contacts by transients induced by said bouncing to postpone such change of stat until after termination of the last of such bounce induced transients, and pulse generating means responsive to transient excursions in the value of said signal in one of the positive-going and negative-going directions for such excursions to convert those of such excursions which are in such one direction into triggering, excursions in the opposite of said directions, said pulse generating means being coupled to said multivibrator means to supply said triggering excursions thereto as triggers therefor.

4. Pulse generating means comprising, input terminals, first d.c. conductive impedance means in circuit between said terminals, the series combination of inductive means and second d.c. conductive impedance means in a circuit path shunting said first impedance means, the series combination of capacitive means and diode means in a circuit path shunting said inductive means, said diode means being connected in such path to have its low forward resistance in the direction towards said second impedance means, third d.c. conductive impedance means shunting said capacitive means, and output terminals coupled, with such second impedance means so that it is in circuit between them.

* * * * *